(12) United States Patent
Moon

(10) Patent No.: US 11,455,123 B2
(45) Date of Patent: Sep. 27, 2022

(54) DATA STORAGE APPARATUS FOR THERMAL THROTTLING AND OPERATION METHOD THEREOF

(71) Applicant: SK hynix Inc., Gyeonggi-do (KR)

(72) Inventor: Ji Ho Moon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 15 days.

(21) Appl. No.: 17/006,117

(22) Filed: Aug. 28, 2020

(65) Prior Publication Data

US 2021/0303211 A1 Sep. 30, 2021

(30) Foreign Application Priority Data

Mar. 31, 2020 (KR) ........................ 10-2020-0038827

(51) Int. Cl.
*G06F 3/06* (2006.01)
*G11C 11/56* (2006.01)
*G11C 16/04* (2006.01)

(52) U.S. Cl.
CPC .......... *G06F 3/0659* (2013.01); *G06F 3/0616* (2013.01); *G06F 3/0653* (2013.01); *G06F 3/0679* (2013.01); *G11C 11/56* (2013.01); *G11C 16/0483* (2013.01)

(58) Field of Classification Search
CPC .... G06F 3/0659; G06F 3/0616; G06F 3/0653; G06F 3/0679; G06F 3/0613; G06F 3/0625; G06F 3/0655; G06F 3/0658; G11C 11/56; G11C 16/0483; G11C 5/14; G11C 7/04; G01K 1/022; G01K 1/024; G01K 1/028

USPC .......... 711/154, 167, 103; 356/211; 365/211
See application file for complete search history.

(56) References Cited

U.S. PATENT DOCUMENTS

| | | | | |
|---|---|---|---|---|
| 2012/0066439 | A1* | 3/2012 | Fillingim | G06F 11/3433 711/103 |
| 2015/0032948 | A1* | 1/2015 | Yoon | G06F 3/0653 711/103 |
| 2018/0046231 | A1* | 2/2018 | Raghu | G06F 3/0653 |
| 2019/0155538 | A1* | 5/2019 | Kim | G06F 3/0634 |
| 2019/0339755 | A1* | 11/2019 | Chai | G06F 1/263 |
| 2021/0132817 | A1* | 5/2021 | Bhat | G06F 3/0658 |
| 2021/0326059 | A1* | 10/2021 | Kim | G06F 3/0634 |

FOREIGN PATENT DOCUMENTS

| | | |
|---|---|---|
| KR | 10-2016-0137180 | 11/2016 |
| KR | 10-2018-0130872 | 12/2018 |

\* cited by examiner

*Primary Examiner* — Hong C Kim
(74) *Attorney, Agent, or Firm* — IP & T Group LLP

(57) ABSTRACT

A data storage apparatus may include a storage and a controller configured to operate in a throttling mode including a first performance mode and a second performance mode based on measured temperature of the storage. The controller comprises a performance adjusting component configured to determine target performance of the first performance mode based on at least one of temperature of the storage and the number of entries into the second performance mode when the temperature of the storage is greater than or equal to a first threshold value.

17 Claims, 6 Drawing Sheets

DATA STORAGE APPARATUS FOR THERMAL THROTTLING AND OPERATION METHOD THEREOF

CROSS-REFERENCE TO RELATED APPLICATION

The present application claims priority under 35 U.S.C. § 119(a) to Korean application number 10-2020-0038827, filed on Mar. 31, 2020, in the Korean Intellectual Property Office, which is incorporated herein by reference in its entirety.

BACKGROUND

1. Technical Field

Various embodiments generally relate to a semiconductor integrated apparatus, and more particularly, to a data storage apparatus and an operation method thereof.

2. Related Art

A data storage apparatus is connected to a host and performs a data input/output operation according to a request of the host.

The data throughput and speed of data storage apparatuses have increasingly improved, resulting in an increase in a power consumption and a resultant rise in temperature.

In order to prevent or at least significantly reduce the extent of damage to a data storage apparatus due to a rise in temperature, a throttling function of adjusting the performance of the data storage apparatus is introduced.

Throttling is a function of determining whether an overload of an electronic device has occurred based on the temperature of the electronic device, and substantially maintaining or lowering the temperature of the electronic device by lowering the performance of the electronic device when the temperature of the electronic device rises above preset temperature.

Although the temperature of the electronic device may be lowered by the throttling, the associated decrease in performance lessens the user's satisfaction in using the device.

SUMMARY

In an embodiment, a data storage apparatus may include: a storage configured to store data; and a controller configured to exchange data with the storage in response to a request of a host and to operate in a throttling mode including a first performance mode and a second performance mode based on measured temperature of the storage The controller comprises: a performance adjusting component configured to determine target performance of the first performance mode based on at least one of temperature of the storage and the number of entries into the second performance mode when the temperature of the storage is greater than or equal to a first threshold value.

In an embodiment, a data storage apparatus may include: a storage configured to store data; and a controller configured to exchange data with the storage in response to a request of a host, and to operate in a throttling mode including a first performance mode and a second performance mode based on measured temperature measurement of the storage. The controller is configured to determine target performance of the first performance mode based on history of entry into the throttling mode.

In an embodiment, an operation method of a data storage apparatus, which includes a storage configured to store data and a controller configured to exchange data with the storage in response to a request of a host, may include: determining, by the controller, whether to enter a throttling mode including a first performance mode and a second performance mode based on measured temperature of the storage; comparing, by the controller, the temperature with a first threshold value; and determining, by the controller, target performance of the first performance mode based on at least one of the temperature of the storage and the number of entries into the second performance mode when the temperature of the storage is greater than or equal to the first threshold value.

In an embodiment, a data storage apparatus may include: a storage including a temperature sensor; and a controller suitable for: receiving, from the storage, a signal indicative of the temperature of the storage; controlling the storage to operate in a first temperature throttling mode such that the data storage apparatus operates at a first percentage of maximum performance when the temperature of the storage is greater than or equal to a first threshold value; controlling the storage to operate in a second temperature throttling mode such that the data storage apparatus operates at a second percentage of maximum performance when the temperature of the storage is greater than or equal to a second threshold value, which is greater than the first threshold value, wherein the first percentage is adjusted based on the number of entries into the second temperature throttling mode.

DETAILED DESCRIPTION

Hereinafter, embodiments of the present invention are described in more detail with reference to the accompanying drawings. Throughout the specification, reference to "an embodiment" or the like is not necessarily to only one embodiment, and different references to any such phrase are not necessarily to the same embodiment(s).

Figure 1:
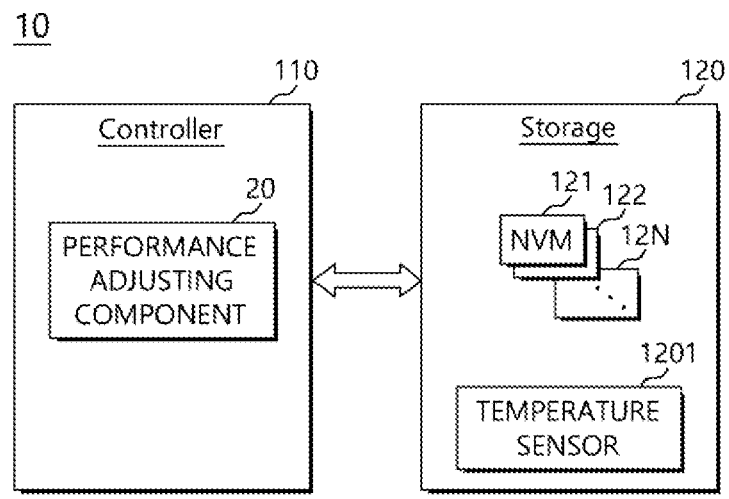
FIG. 1 is a diagram of a configuration of a data storage apparatus in accordance with an embodiment.

FIG. 1 is a diagram showing a configuration of a data storage apparatus 10 in accordance with an embodiment.

Referring to FIG. 1, the data storage apparatus 10 may include a controller 110 and a storage 120.

The controller 110 may control the storage 120 in response to a request of a host. For example, the controller 110 may allow data to be programmed in the storage 120 at a program (or write) request of the host. Furthermore, the controller 110 may provide the data written in the storage 120 to the host in response to a read request of the host.

The storage 120 may write data or output the written data under the control of the controller 110. The storage 120 may include a plurality of nonvolatile memory (NVM) apparatuses (or elements) 121 to 12N. In an embodiment, the storage 120 may be implemented using any of various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin torque transfer magnetic RAM (STT-MRAM). The storage 120 may include a plurality of dies Die 0 to Die n, a plurality of chips, or a plurality of packages. In addition, the storage 120 may operate as a single-level cell that stores one-bit data in one memory cell or a multi-level cell that stores multi-bit data in one memory cell.

Although not illustrated in the drawing, a buffer memory may be provided inside or outside the controller 110. The buffer memory serves as a space capable of temporarily storing data when the data storage apparatus 10 performs a series of operations of writing or reading data in cooperation with the host.

In an embodiment, the storage 120 may include a temperature sensor 1201 that measures the temperature of the storage 120. As the performance of the data storage apparatus 10 increases, power consumption may also increase, resulting in an increase in the amount of heat generated by the storage 120. The temperature sensor 1201 may measure the temperature of the storage 120 and provide the measured temperature to the controller 110.

The controller 110 may include a performance adjusting component 20 that receives the temperature measurement of the temperature sensor 1201 and adjusts the performance of the data storage apparatus 10. The performance adjusting component 20 may output a throttling signal for controlling the performance of the data storage apparatus 10 when the temperature of the storage 120 rises above a set value.

In an embodiment, when the measured temperature is greater than or equal to a first threshold value MT1, the performance adjusting component 20 may switch an operation mode of the data storage apparatus 10 to a throttling mode, determine target performance P_m1 of the data storage apparatus 10, and control the data storage apparatus 10 to operate in a first performance mode PM1. When the measured temperature of the storage 120 is greater than or equal to a second threshold value MT2, greater than the first threshold value MT1, after the data storage apparatus 10 operates in the first performance mode PM1 for a set period of time, the performance adjusting component 20 may control the data storage apparatus 10 to operate in a second performance mode PM2.

In an embodiment, according to the temperature measured by the temperature sensor 1201, the data storage apparatus 10 may operate in a normal mode which provides default performance, for example, maximum performance, or the throttling mode with performance adjusted by the performance adjusting component 20. The throttling mode may include the first performance mode PM1 and the second performance mode PM2. The first performance mode PM1 may be a dynamic performance mode in which, when the temperature of the storage 120 is greater than or equal to the first threshold value MT1, the data storage apparatus 10 operates with performance determined based on at least one of the temperature of the storage 120 and the number $N_pM2$ of times the data storage apparatus 10 entered into the second performance mode PM2 after transit to throttling mode. The second performance mode PM2 may be, for example, a minimum performance mode in which, when the temperature of the storage 120 is greater than or equal to the second threshold value MT2, the data storage apparatus 10 operates with performance lower than the default performance mode.

In embodiments of the present invention, the performance of the first performance mode PM1 is not fixed and target performance thereof is determined according to at least one of the temperature of the storage 120 and the number $N_{PM2}$ of entries into the second performance mode PM2. When considering the number $N_{PM2}$ of entries into the second performance mode PM2 in order to determine the target performance, it is possible to reduce the frequency at which the data storage apparatus 10 enters the second performance mode PM2 and operates in the minimum performance mode. When considering the temperature of the storage 120 in order to determine the target performance, it is possible to adaptively determine performance based on change in temperature of the storage 120.

In an embodiment, the performance adjusting component 20 may determine the target performance by degrading the maximum performance of the data storage apparatus 10 by a determined value.

A data storage mode of the storage 120 may operate as a single-level cell (SLC) mode in which single bit data is stored in each memory cell and an extra-level cell (XLC) mode in which multi-bit data is stored in each memory cell, and maximum performance thereof may be changed according to the data storage mode. The performance adjusting component 20 may determine the target performance based on the maximum performance determined according to the data storage mode of the storage 120.

In an embodiment, the performance of the data storage apparatus 10 may be changed according to bandwidth, which may be bandwidth of the host in which the data storage apparatus 10 is embedded. The performance adjusting component 20 may adjust the target performance based on the maximum performance determined according to the bandwidth of the host in which the data storage apparatus 10 is embedded.

As described above, the maximum performance of the data storage apparatus 10 may be determined according to at least one of the data storage mode and the bandwidth of the host, and the performance adjusting component 20 may determine the target performance based on the maximum performance.

In an embodiment, in order to adjust the performance of the data storage apparatus 10, various methods may be used, such as delaying a time at which the controller 110 applies a command to the storage 120, reducing a data input/output speed of the controller 110, and reducing a frequency of a timing signal or a clock signal inputted to the storage 120. In another aspect, an operation of adjusting the performance may be an operation of changing the number of active memory dies in the storage 120, or reducing the number of memory apparatuses which are simultaneously accessed by the controller 110; however, the present invention is not limited thereto.

In another aspect, the performance adjusting component 20 may determine the target performance of the first performance mode PM1 based on throttling mode entry history.

In an embodiment, the throttling mode entry history may include the number of entries into the second performance mode PM2. The performance adjusting component 20 may degrade the target performance of the first performance mode PM1 adaptively based on the number of entries into the second performance mode PM2.

Figure 2:
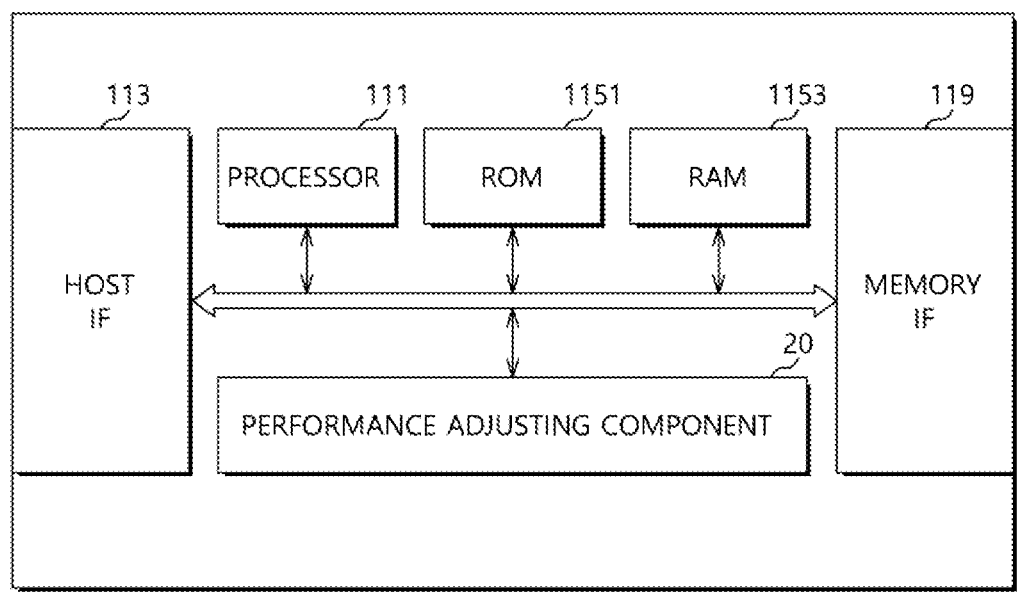
FIG. 2 is a diagram of a configuration of a controller in accordance with an embodiment.

FIG. 2 is a diagram showing a configuration of the controller 110 in accordance with an embodiment.

Referring to FIG. 2, the controller 110 may include a processor 111, a host interface (IF) 113, a read only memory (ROM) 1151, a random access memory (RAM) 1153, a memory interface (IF) 119, and the performance adjusting component 20.

The processor 111 may be configured to transfer various types of control information for a data read or write operation for the storage 120 to the host IF 113, the memory IF 119, and the performance adjusting component 20. In an embodiment, the processor 111 may operate according to firmware provided for various operations of the data storage apparatus 10. In an embodiment, the processor 111 may perform a function of a flash translation layer (FTL) for performing garbage collection, address mapping, and wear leveling for managing the storage 120, a function of detecting and correcting an error of data read from the storage 120.

The host IF 113 may provide a communication channel for receiving a command and a clock signal from the host and controlling data input/output under the control of the processor 111. Particularly, the host IF 113 may provide a physical connection between the host and the data storage apparatus 10. Furthermore, the host IF 113 may provide interfacing with the data storage apparatus 10 in correspondence to a bus format of the host. The bus format of the host may include at least one of standard interface protocols such as a secure digital, a universal serial bus (USB), a multimedia card (MMC), an embedded MMC (eMMC), a personal computer memory card international association (PCMCIA), a parallel advanced technology attachment (PATA), a serial advanced technology attachment (SATA), a small computer system interface (SCSI), a serial attached SCSI (SAS), a peripheral component interconnection (PCI), a PCI express (PCI-e or PCIe), and/or a universal flash storage (UFS).

The ROM 1151 may store program codes for the operation of the controller 110, for example, firmware or software, and store code data used by the program codes.

The RAM 1153 may store data for the operation of the controller 110 or data generated by the controller 110.

The processor 111 may load a boot code stored in the storage 120 or the ROM 1151 to the RAM 1153 at the time of a boot operation, thereby controlling the booting operation of the data storage apparatus 10.

The memory IF 119 may provide a communication channel for signal transmission/reception between the controller 110 and the storage 120. The memory IF 119 may write data to be written in the storage 120 under the control of the processor 111. Furthermore, the memory IF 119 may transfer data read from the storage 120 to the host through the host IF 113.

The performance adjusting component 20 may control the data storage apparatus 10 to operate in the normal mode with default performance, for example, maximum performance, when a temperature measurement value TEMP of the temperature sensor 1201 in the storage 120 is less than the first threshold value MT1, and operate the data storage apparatus 10 in the throttling mode in which the performance of the data storage apparatus 10 is degraded when the temperature measurement value TEMP is greater than or equal to the first threshold value MT1. The throttling mode may include the first performance mode PM1 and the second performance mode PM2. The target performance of the first performance mode PM1 may be determined based on at least one of the temperature of the storage 120 and the number $N_{PM2}$ of entries into the second performance mode PM2.

The performance adjusting component 20 may control the data storage apparatus 10 to operate in the second performance mode PM2 when the measured temperature of the storage 120 is greater than or equal to the second threshold value MT2 greater than the first threshold value MT1 (i.e., >MT1) after the data storage apparatus 10 operates in the first performance mode PM1 for a set amount of time.

In another aspect, the performance adjusting component 20 may determine the target performance of the first performance mode PM1 based on the throttling mode entry history. In an embodiment, the throttling mode entry history may include the number $N_{PM2}$ of times the storage apparatus 10 enters into the second performance mode PM2. The performance adjusting component 20 may degrade the target performance of the first performance mode PM1 adaptively based on the number $N_{PM2}$ of entries into the second performance mode PM2.

Figure 3:
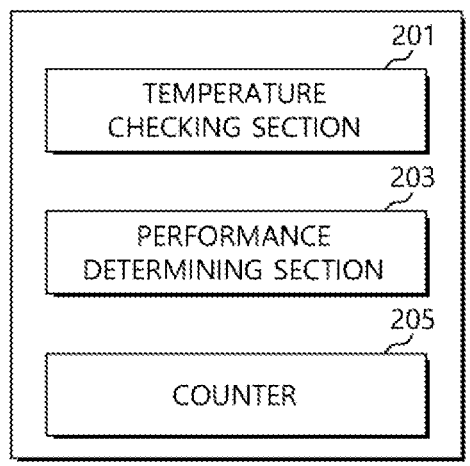
FIG. 3 is a diagram of a performance adjusting component in accordance with an embodiment.
Figure 4:
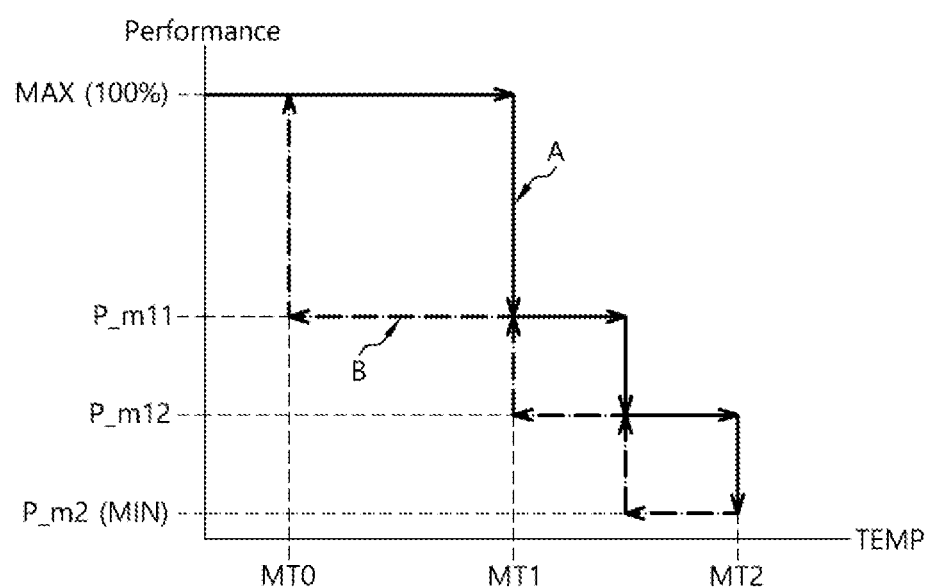
FIG. 4 is a graph for explaining a throttling concept in accordance with an embodiment.

FIG. 3 is a configuration diagram of the performance adjusting component 20 in accordance with an embodiment, and FIG. 4 is a graph for explaining the throttling concept in accordance with an embodiment.

Referring to FIG. 3, the performance adjusting component 20 may include a temperature checking section 201, a performance determining section 203, and a counter 205.

The temperature checking section 201 may be configured to receive the temperature measurement value TEMP from the temperature sensor 1201, compare the temperature measurement value TEMP with the threshold value MT1 or MT2, and output a comparison value.

The performance determining section 203 may be configured to determine the performance mode of the data storage apparatus 10 based on the comparison value of the temperature checking section 201 and the throttling mode entry history, and output a performance control signal.

In an embodiment, the performance determining section 203 may control the data storage apparatus 10 to operate in the normal mode with default performance, for example, maximum performance, when the temperature measurement value TEMP is smaller than the first threshold value MT1. Referring to a graph A of FIG. 4, when the temperature measurement value TEMP (=MT0) is less than the first threshold value MT1, the data storage apparatus 10 may operate with maximum performance MAX.

The performance determining section 203 may control the data storage apparatus 10 to operate in the throttling mode when the temperature measurement value TEMP is greater than or equal to the first threshold value MT1. The throttling mode may include the first performance mode PM1 and the second performance mode PM2. The performance determining section 203 may determine the target performance of the first performance mode PM1 based on at least one of the temperature of the storage 120 and the number $N_{PM2}$ of entries into the second performance mode PM2. Referring to the graph A of FIG. 4, the performance determining section 203 may determine the target performance of the first performance mode PM1 as first performance P_m11 and operate the data storage apparatus 10.

Referring to a graph B of FIG. 4, as the data storage apparatus 10 operates in the first performance mode PM1 with the first performance P_m11, the temperature of the data storage apparatus 10 may fall. When the temperature gradually falls and becomes less than the first threshold value MT1, the performance determining section 203 may control the data storage apparatus 10 to operate in the normal mode again.

On the other hand, when the temperature measurement value TEMP is still greater than or equal to the first threshold value MT1 and less than the second performance mode PM2 while the data storage apparatus 10 operates with the first performance P_m11, the performance determining section 203 may adjust the target performance of the first performance mode PM1 as second performance P_m12 to degrade the target performance.

In an embodiment, the performance determining section 203 may determine the performance based on the following Equation 1; however, the present invention is not limited thereto.

$$P\_m1 = MAX * A\% - OFFSET * N_{PM2} \quad \text{Equation 1}$$

In Equation 1, MAX denotes maximum performance, A=positive number from 40 to 60, and $N_{PM2}$ denotes the number of entries into the second performance mode PM2.

In Equation 1, OFFSET=set value.

As illustrated in the graph A of FIG. 4, as the target performance is degraded to the second performance P_m12, the temperature of the data storage apparatus 10 may fall as illustrated in the graph B of FIG. 4.

In an embodiment, when the target performance P_m1 of the first performance mode PM1 determined by the performance determining section 203 is less than or equal to the performance P_m2 of the second performance mode PM2, the performance determining section 203 may control the data storage apparatus 10 to operate in the second performance mode PM2.

When the temperature measurement value is greater than or equal to the second threshold value MT2 greater than the first threshold value MT1 (i.e., >MT1) while the data storage apparatus 10 operates in the first performance mode PM1, the performance adjusting component 20 may control the data storage apparatus 10 to operate in the second performance mode PM2. Referring to the graph A of FIG. 4, when the temperature measurement value TEMP is greater than or equal to the second threshold value MT2, the performance determining section 203 may control the data storage apparatus 10 to operate with the second performance P_m2 which is minimum performance MIN.

As illustrated in the graph A of FIG. 4, as the target performance is degraded to the second performance P_m12, the temperature of the data storage apparatus 10 may fall as illustrated in the graph B of FIG. 4.

As described above, the performance adjusting component 20 may degrade the target performance of the first performance mode PM1 adaptively with respect to the number $N_{PM2}$ of entries into the second performance mode PM2 based on the throttling mode entry history including the number $N_{PM2}$ of entries into the second performance mode PM2.

The counter 205 may count the number $N_{PM2}$ of times the data storage apparatus 10 has entered the second performance mode PM2, based on the determination of the performance determining section 203, and provide the count value to the performance determining section 203. As the data storage apparatus 10 operates in the throttling mode, when the temperature of the data storage apparatus 10, substantially the temperature of the storage 120 falls below the first threshold value MT1, the counter 205 may reset $N_{PM2}$.

Figure 5:
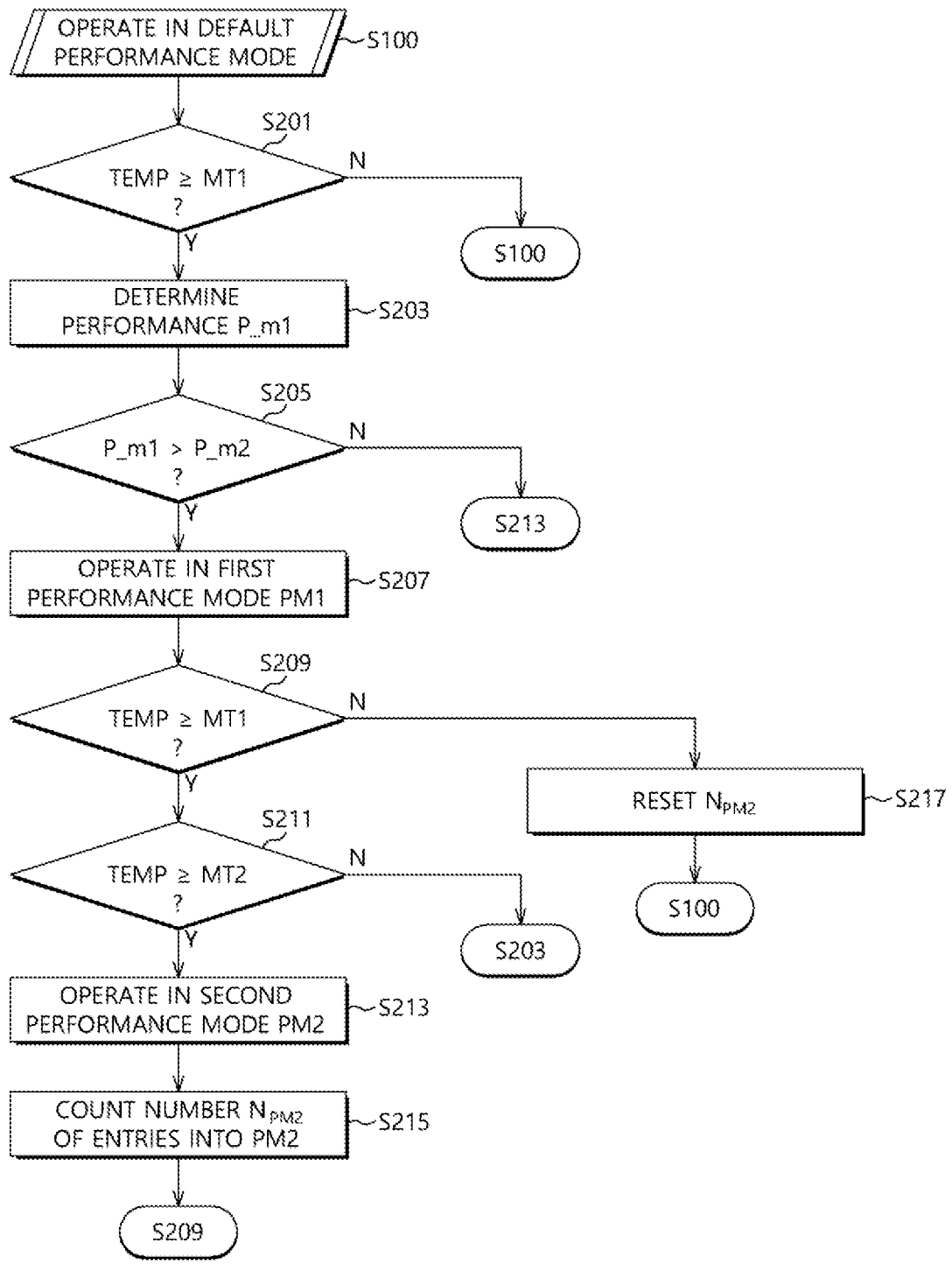
FIG. 5 is a flowchart illustrating an operation method of the data storage apparatus in accordance with an embodiment.

FIG. 5 is a flowchart illustrating an operation method of the data storage apparatus 10 in accordance with an embodiment.

Referring to FIG. 5, while the data storage apparatus 10 operates in the default performance mode (S100), the controller 110 may receive a temperature measurement value TEMP from the temperature sensor 1201 and compare the temperature measurement value TEMP with the first threshold value MT1 (S201).

As a result of the comparison, when the temperature measurement value TEMP is less than the first threshold value MT1 (S201: N), the controller 110 may continue to operate the data storage apparatus 10 in the default performance mode (S100).

As a result of the comparison, when the temperature measurement value TEMP is greater than or equal to the first threshold value MT1 (S201: Y), the controller 110 may determine the target performance P_m1 of the first performance mode PM1 in order to switch the mode of the data storage apparatus 10 to the throttling mode (S203). In an embodiment, the throttling mode may include the first performance mode PM1 and the second performance mode PM2, and the controller 110 may determine the target performance P_m1 of the first performance mode PM1 based on at least one of the temperature of the storage 120 and the number $N_{PM2}$ of entries into the second performance mode PM2. In an embodiment, the controller 110 may determine the target performance P_m1 based on Equation 1 above.

The controller 110 may compare the target performance P_m1 determined in step S203 with the performance P_m2 of the second performance mode PM2 (S205). When the determined target performance P_m1 is greater than the performance P_m2 of the second performance mode PM2 (S205: Y), the controller 110 may control the data storage apparatus 10 to operate in the first performance mode PM1 with the determined target performance P_m1 (S207).

In an embodiment, when the target performance P_m1 determined in step S203 is less than or equal to the performance P_m2 of the second performance mode PM2 (S205: N), the controller 110 may control the data storage apparatus 10 to operate in the second performance mode PM2 (S213).

As the data storage apparatus 10 operates in the first performance mode PM1 with the first performance P_m1, the temperature thereof may fall or rise.

The controller 110 may compare a temperature measurement value TEMP with the first threshold value MT1 while the data storage apparatus 10 operates in the first performance mode PM1 with the first performance P_m1 (S209).

As a result of the comparison, when the temperature measurement value TEMP is less than the first threshold value MT1 (S209: N), the controller 110 may reset the number $N_{PM2}$ of entries into the second performance mode PM2 (S217), and operate the data storage apparatus 10 in the default performance mode (S100).

However, when the temperature measurement value TEMP is greater than or equal to the first threshold value MT1 (S209: Y), the controller 110 may check whether the temperature measurement value TEMP is greater than or equal to the second threshold value MT2 (S211).

When the temperature measurement value TEMP is less than the second threshold value MT2 (S211: N), that is, when the temperature measurement value TEMP is greater than or equal to the first threshold value MT1 and is less than the second threshold value MT2, the controller 110 may determine that the temperature of the data storage apparatus 10 is still high, determine the target performance P_m1 of the first performance mode PM1 again (S203), and repeat the processes after step S203.

However, when the temperature measurement value TEMP is greater than or equal to the second threshold value MT2 (S211: Y), that is, when the heat generation amount of the data storage apparatus 10 rises above the second threshold value MT2 in spite of degrading the performance of the data storage apparatus 10 to the first performance mode PM1, the controller 110 may control the data storage apparatus 10 to operate in the second performance mode PM2 (S213). In addition, the controller 110 may count the number $N_{PM2}$ of entries into the second performance mode PM2 (S215).

In an embodiment, as the data storage apparatus 10 operates in the second performance mode PM2, which is a minimum performance mode, the temperature of the data storage apparatus 10 may fall. Accordingly, the controller 110 may proceed to step S209 and repeat the processes of the step of comparing the temperature measurement value TEMP with the first threshold value MT1.

Although the data storage apparatus 10 operates in the first performance mode for throttling and the performance of the data storage apparatus 10 is degraded, when the temperature of the data storage apparatus 10 continuously rises to enter the minimum performance mode, user's satisfaction for performance may not be satisfied.

Entering the second performance mode after throttling to the first performance mode may indicate that the amount of heat generated by the data storage apparatus 10 may not be lowered in the first performance mode.

In embodiments of the present invention, when it is necessary to operate the data storage apparatus 10 in the first performance mode because the temperature of the data storage apparatus 10 does not sufficiently fall even after throttling to the second performance mode, the target performance of the first performance mode may be determined in consideration of at least the number of entries into the minimum performance mode.

Accordingly, by gradually degrading the performance of the first performance mode, it is possible to reduce the number of times which the data storage apparatus 10 enters the minimum performance mode.

Figure 6:
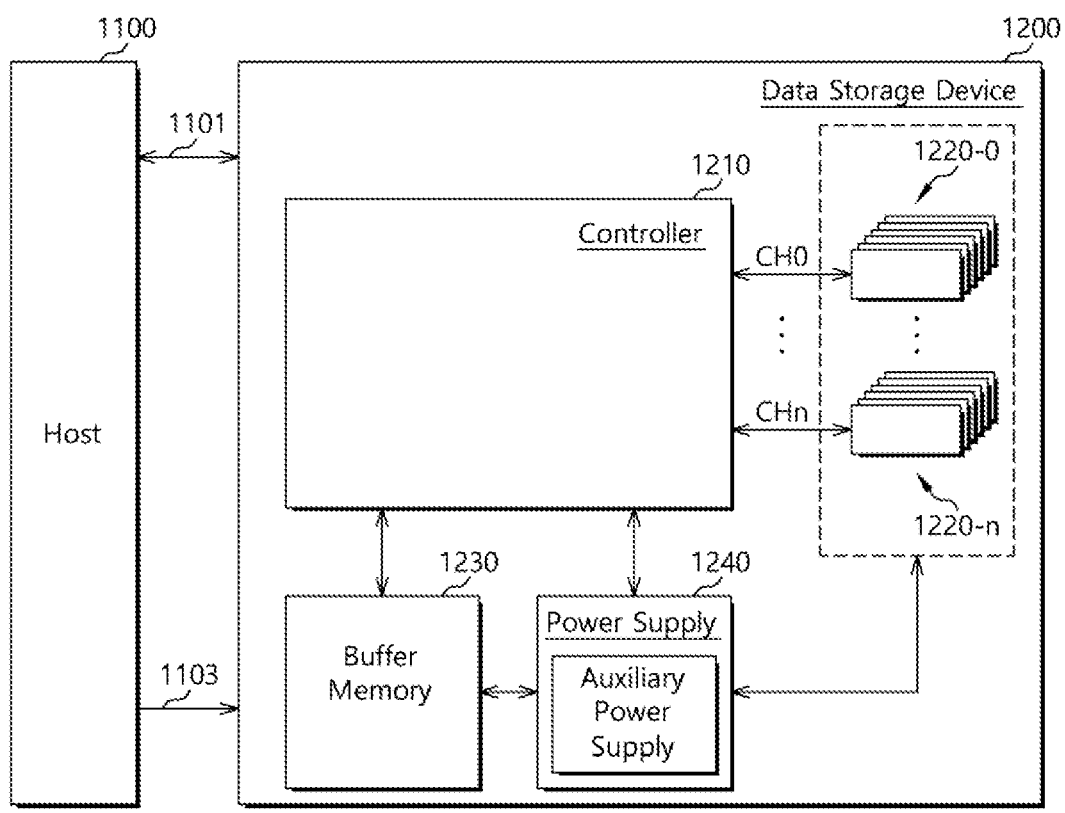
FIG. 6 is a diagram illustrating a data storage system in accordance with an embodiment.

FIG. 6 is a diagram illustrating a data storage system 1000, in accordance with an embodiment.

Referring to FIG. 6, the data storage 1000 may include a host device 1100 and the data storage device 1200. In an embodiment, the data storage device 1200 may be configured as a solid state drive (SSD).

The data storage device 1200 may include a controller 1210, a plurality of nonvolatile memory devices 1220-0 to 1220-$n$, a buffer memory device 1230, a power supply 1240, a signal connector 1101, and a power connector 1103.

The controller 1210 may control general operation of the data storage device 1200. The controller 1210 may include a host interface, a control component, a random access memory used as a working memory, an error correction code (ECC) component, and a memory interface. In an embodiment, the controller 1210 may configured as controller 110 shown in FIGS. 1 and 2.

The host device 1100 may exchange a signal with the data storage device 1200 through the signal connector 1101. The signal may include a command, an address, data, and the like.

The controller 1210 may analyze and process the signal received from the host device 1100. The controller 1210 may control operations of internal function blocks according to firmware or software for driving the data storage device 1200.

The buffer memory device 1230 may temporarily store data to be stored in at least one of the nonvolatile memory devices 1220-0 to 1220-$n$. Further, the buffer memory device 1230 may temporarily store the data read from at least one of the nonvolatile memory devices 1220-0 to 1220-$n$. The data temporarily stored in the buffer memory device 1230 may be transmitted to the host device 1100 or at least one of the nonvolatile memory devices 1220-0 to 1220-$n$ according to control of the controller 1210.

The nonvolatile memory devices 1220-0 to 1220-$n$ may be used as storage media of the data storage device 1200. The nonvolatile memory devices 1220-0 to 1220-$n$ may be coupled with the controller 1210 through a plurality of channels CH0 to CHn, respectively. One or more nonvolatile memory devices may be coupled to one channel. The nonvolatile memory devices coupled to each channel may be coupled to the same signal bus and data bus.

The power supply 1240 may provide power inputted through the power connector 1103 to the controller 1210, the nonvolatile memory devices 1220-0 to 1220-$n$ and the buffer memory device 1230 of the data storage device 1200. The power supply 1240 may include an auxiliary power supply. The auxiliary power supply may supply power to allow the data storage device 1200 to be properly terminated when a sudden power interruption occurs. The auxiliary power supply may include bulk-capacity capacitors sufficient to store the needed charge.

The signal connector 1101 may be configured as any of various types of connectors depending on an interface scheme between the host device 1100 and the data storage device 1200.

The power connector 1103 may be configured as any of various types of connectors depending on a power supply scheme of the host device 1100.

Figure 7:
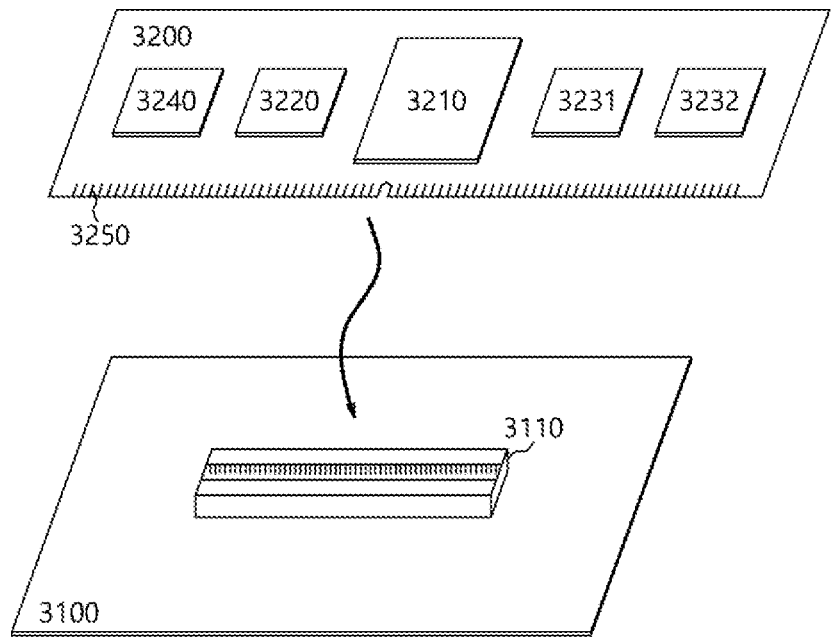
FIGS. 7 and 8 are diagrams illustrating a data processing system in accordance with an embodiment.

FIG. 7 is a diagram illustrating a data processing system 3000, in accordance with an embodiment. Referring to FIG. 7, the data processing system 3000 may include a host device 3100 and a memory system 3200.

The host device 3100 may be configured in the form of a board, such as a printed circuit board. Although not shown, the host device 3100 may include internal function blocks for performing the function of a host device.

The host device 3100 may include a connection terminal 3110, such as a socket, a slot, or a connector. The memory system 3200 may be mated to the connection terminal 3110.

The memory system 3200 may be configured in the form of a board, such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control general operation of the memory system 3200. The controller 3210 may be configured in the same manner as the controller 110 shown in FIGS. 1 and 2.

The buffer memory device 3220 may temporarily store data to be stored in the nonvolatile memory devices 3231 and 3232. Further, the buffer memory device 3220 may temporarily store data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250 to the inside of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, data, and so forth, and power may be transferred between the host device 3100 and the memory system 3200. The connection terminal 3250 may be configured as any of various types depending on an interface scheme between the host device 3100 and the memory system 3200. The connection terminal 3250 may be disposed on a side of the memory system 3200, as shown.

Figure 8:
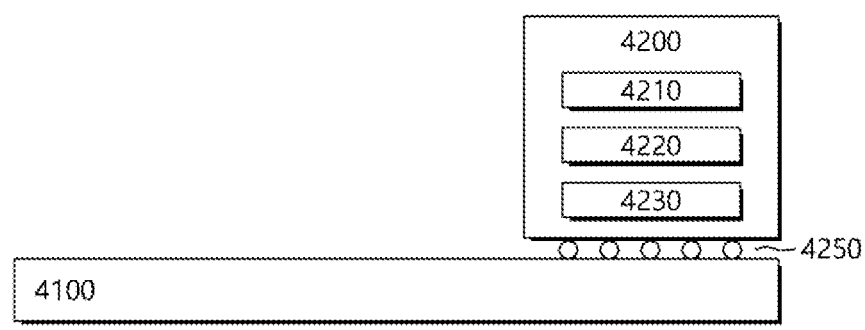

FIG. 8 is a diagram illustrating a data processing system 4000 in accordance with an embodiment. Referring to FIG. 8, the data processing system 4000 may include a host device 4100 and a memory system 4200.

The host device 4100 may be configured in the form of a board, such as a printed circuit board. Although not shown, the host device 4100 may include internal function blocks for performing the function of a host device.

The memory system 4200 may be configured in the form of a surface-mounted type package. The memory system 4200 may be mounted to the host device 4100 through solder balls 4250. The memory system 4200 may include a controller 4210, a buffer memory device 4220, and a nonvolatile memory device 4230.

The controller 4210 may control general operation of the memory system 4200. The controller 4210 may be configured in the same manner as the controller 110 shown in FIGS. 1 and 2.

The buffer memory device 4220 may temporarily store data to be stored in the nonvolatile memory device 4230. Further, the buffer memory device 4220 may temporarily store data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the storage medium of the memory system 4200.

Figure 9:
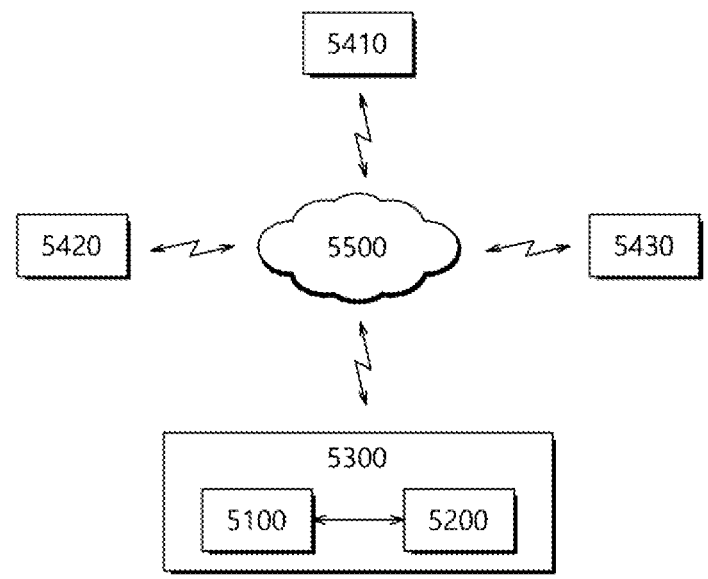
FIG. 9 is a diagram illustrating a network system including a data storage device in accordance with an embodiment.

FIG. 9 is a diagram illustrating a network system 5000 including a data storage device, in accordance with an embodiment. Referring to FIG. 9, the network system 5000 may include a server system 5300 and a plurality of client systems 5410, 5420, and 5430, which are coupled through a network 5500.

The server system 5300 may service data in response to requests from the plurality of client systems 5410 to 5430. For example, the server system 5300 may store the data provided by the plurality of client systems 5410 to 5430. For another example, the server system 5300 may provide data to the plurality of client systems 5410 to 5430.

The server system 5300 may include a host device 5100 and a memory system 5200. The memory system 5200 may be configured as the memory system 10 shown in FIG. 1, the data storage device 1200 shown in FIG. 6, the memory system 3200 shown in FIG. 7, or the memory system 4200 shown in FIG. 8.

Figure 10:
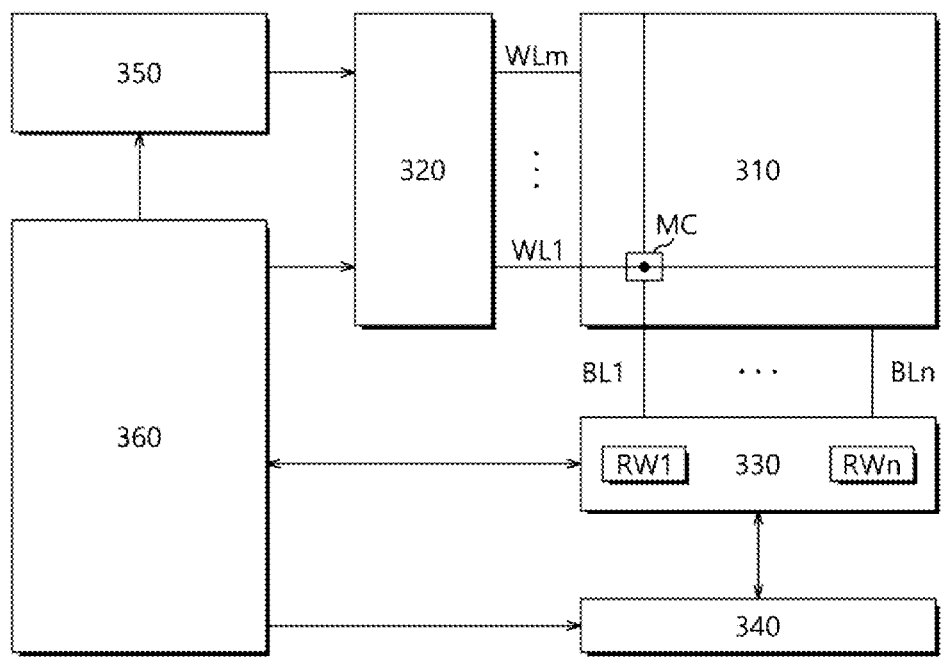
FIG. 10 is a block diagram illustrating a nonvolatile memory device included in a data storage device in accordance with an embodiment.

FIG. 10 is a block diagram illustrating a nonvolatile memory device 300 included in a data storage device, such as the data storage device 10, in accordance with an embodiment. Referring to FIG. 10, the nonvolatile memory device 300 may include a memory cell array 310, a row decoder 320, a data read/write block 330, a column decoder 340, a voltage generator 350, and control logic 360.

The memory cell array 310 may include memory cells MC which are arranged at areas where word lines WL1 to WLm and bit lines BL1 to BLn intersect with each other.

The memory cell array 310 may comprise a three-dimensional memory array. The three-dimensional memory array, for example, has a stacked structure extending in a direction perpendicular to the flat surface of a semiconductor substrate. Moreover, the three-dimensional memory array means a structure including NAND strings which memory cells comprised in NAND strings are stacked perpendicular to the flat surface of a semiconductor substrate.

The structure of the three-dimensional memory array is not limited to the embodiment indicated above. The memory array structure can be formed in a highly integrated manner with horizontal directionality as well as vertical directionality. In an embodiment, in the NAND strings of the three-dimensional memory array, memory cells are arranged parallel and perpendicular with respect to the surface of the semiconductor substrate. The memory cells may be variously spaced to provide different degrees of integration.

The row decoder 320 may be coupled with the memory cell array 310 through the word lines WL1 to WLm. The row decoder 320 may operate according to control of the control logic 360. The row decoder 320 may decode an address provided by an external device (not shown). The row decoder 320 may select and drive the word lines WL1 to WLm, based on a decoding result. For instance, the row decoder 320 may provide a word line voltage, provided by the voltage generator 350, to the word lines WL1 to WLm.

The data read/write block 330 may be coupled with the memory cell array 310 through the bit lines BL1 to BLn. The data read/write block 330 may include read/write circuits RW1 to RWn, respectively, corresponding to the bit lines BL1 to BLn. The data read/write block 330 may operate according to control of the control logic 360. The data read/write block 330 may operate as a write driver or a sense amplifier, according to an operation mode. For example, the data read/write block 330 may operate as a write driver, which stores data provided by the external device in the memory cell array 310 in a write operation. For another example, the data read/write block 330 may operate as a sense amplifier, which reads out data from the memory cell array 310 in a read operation.

The column decoder 340 may operate according to control of the control logic 360. The column decoder 340 may decode an address provided by the external device. The column decoder 340 may couple the read/write circuits RW1 to RWn of the data read/write block 330, respectively corresponding to the bit lines BL1 to BLn, with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operation of the nonvolatile memory device 300, based on control signals provided by the external device. For example, the control logic 360 may control operations of the nonvolatile memory device 300 such as read, write, and erase operations of the nonvolatile memory device 300.

Although various embodiments of the present invention have been illustrated and described, those skilled in the art to which the present disclosure pertains will understand that the present invention may be carried out in other ways without departing from the spirit or scope of the invention. Therefore, the embodiments described above are illustrative in all exemplary in all respects, not limiting. The scope of the present invention is defined by the claims rather than the detailed description. Moreover, the present invention embraces all modifications and variations of the any of the disclosed embodiments that fall within the scope of the claims.

What is claimed is:

1. A data storage apparatus comprising:
a storage configured to store data; and
a controller configured to exchange data with the storage in response to a request of a host and to operate in a throttling mode including a first performance mode and a second performance mode based on measured temperature of the storage,
wherein the controller comprises:
a performance adjusting component configured to determine target performance of the first performance mode based on temperature of the storage and the number of entries into the second performance mode when the temperature of the storage is greater than or equal to a first threshold value.

2. The data storage apparatus according to claim 1, wherein the controller is configured to operate in the first performance mode when the temperature of the storage is greater than or equal to the first threshold value, and to operate in the second performance mode when the temperature of the storage is greater than or equal to a second threshold value, which is greater than the first threshold value.

3. The data storage apparatus according to claim 2, wherein the controller is configured to operate in the second performance mode when the temperature of the storage is greater than or equal to the second threshold value after entering the first performance mode.

4. The data storage apparatus according to claim 1, wherein the storage operates in a data storage mode selected from a single-level cell (SLC) mode in which single bit data is stored in each memory cell and an extra-level cell (XLC) mode in which multi-bit data is stored in each memory cell, and
the controller is configured to determine the target performance based on maximum performance determined according to the data storage mode.

5. The data storage apparatus according to claim 1, wherein the controller is configured to determine the target performance based on maximum performance determined according to bandwidth of the host.

6. The data storage apparatus according to claim 1, wherein the controller is configured to count the number of entries into the second performance mode, and to reset the count when the temperature measurement result is less than the first threshold value.

7. The data storage apparatus according to claim 1, wherein the controller is configured to adjust the target performance by delaying a time at which the controller applies a command to the storage, reducing a data input/output speed between the host or the storage and the controller, or reducing a frequency of a clock signal provided to the storage.

8. The data storage apparatus according to claim 1, wherein the storage includes a plurality of memory apparatuses, and
wherein the controller is configured to adjust the target performance by changing the number of active memory apparatuses, or reducing the number of memory apparatuses which are simultaneously accessed by the controller, among the plurality of memory apparatuses.

9. A data storage apparatus comprising:
a storage configured to store data; and
a controller configured to exchange data with the storage in response to a request of a host, and to operate in a throttling mode including a first performance mode and a second performance mode based on measured temperature measurement of the storage,
wherein the controller is configured to determine target performance of the first performance mode based on history of entry into the throttling mode, and
wherein the history of entry into the throttling mode includes the number of entries into the second performance mode which is a lower performance mode than the first performance mode.

10. The data storage apparatus according to claim 9, wherein the controller is configured to degrade the target performance adaptively based on the number of entries into the second performance mode.

11. An operation method of a data storage apparatus including a storage configured to store data and a controller configured to exchange data with the storage in response to a request of a host, the operation method comprising:
determining, by the controller, whether to enter a throttling mode including a first performance mode and a second performance mode based on measured temperature of the storage;
comparing, by the controller, the temperature with a first threshold value; and
determining, by the controller, target performance of the first performance mode based on the temperature of the storage and the number of entries into the second performance mode when the temperature of the storage is greater than or equal to the first threshold value.

12. The operation method according to claim 11, further comprising:
operating, by the controller, in the first performance mode when the temperature is greater than or equal to the first threshold value; and
operating, by the controller, in the second performance mode when the temperature is greater than or equal to a second threshold value, which is greater than the first threshold value.

13. The operation method according to claim 12, further comprising:
operating, by the controller, in the second performance mode when the temperature is greater than or equal to the second threshold value after entering the first performance mode.

14. The operation method according to claim 11, wherein the storage operates in a data storage mode selected from a single-level cell (SLC) mode in which single bit data is stored in each memory cell and an extra-level cell (XLC) mode in which multi-bit data is stored in each memory cell, and the determining of the target performance includes determining the target performance by further using maximum performance determined according to the data storage mode.

15. The operation method according to claim 11, wherein the determining of the target performance includes determining the target performance based on maximum performance determined according to bandwidth of the host.

16. The operation method according to claim 11, further comprising:

counting, by the controller, the number of entries into the second performance mode, and resetting the count when the temperature measurement result is less than the first threshold value.

17. A data storage apparatus comprising:
a storage including a temperature sensor; and
a controller suitable for:
receiving, from the storage, a signal indicative of the temperature of the storage;
controlling the storage to operate in a first temperature throttling mode such that the data storage apparatus operates at a first percentage of maximum performance when the temperature of the storage is greater than or equal to a first threshold value;
controlling the storage to operate in a second temperature throttling mode such that the data storage apparatus operates at a second percentage of maximum performance when the temperature of the storage is greater than or equal to a second threshold value, which is greater than the first threshold value,
wherein the first percentage is adjusted based on the number of entries into the second temperature throttling mode.

* * * * *